United States Patent
Kadoya

(10) Patent No.: US 11,381,055 B2
(45) Date of Patent: Jul. 5, 2022

(54) LASER SYSTEM

(71) Applicant: KYOCERA SOC CORPORATION, Kanagawa (JP)

(72) Inventor: Minoru Kadoya, Machida (JP)

(73) Assignee: KYOCERA SOC CORPORATION, Yokohama (JP)

( * ) Notice: Subject to any disclaimer, the term of this patent is extended or adjusted under 35 U.S.C. 154(b) by 185 days.

(21) Appl. No.: 16/819,272

(22) Filed: Mar. 16, 2020

(65) Prior Publication Data

US 2020/0313384 A1 Oct. 1, 2020

(30) Foreign Application Priority Data

Mar. 25, 2019 (JP) .............................. JP2019-056417

(51) Int. Cl.
| | |
|---|---|
| *H01S 3/13* | (2006.01) |
| *H01S 3/0941* | (2006.01) |
| *H01S 5/0683* | (2006.01) |
| *H01S 5/042* | (2006.01) |
| *H01S 3/131* | (2006.01) |

(52) U.S. Cl.
CPC .......... *H01S 3/1305* (2013.01); *H01S 3/0941* (2013.01); *H01S 5/042* (2013.01); *H01S 5/0683* (2013.01); *H01S 3/1312* (2013.01)

(58) Field of Classification Search
CPC .... H01S 3/0941; H01S 3/1305; H01S 3/1312; H01S 5/042; H01S 5/0683
See application file for complete search history.

(56) References Cited

U.S. PATENT DOCUMENTS

| | | | |
|---|---|---|---|
| 7,166,826 B1 | 1/2007 | Kunst et al. | |
| 2005/0212537 A1* | 9/2005 | Prabhakaran | H03M 1/76 324/723 |

(Continued)

FOREIGN PATENT DOCUMENTS

| | | |
|---|---|---|
| JP | 2000/228552 | 8/2000 |
| JP | 2006/238185 | 9/2006 |

(Continued)

OTHER PUBLICATIONS

ADN2850 datasheet, <https://www.analog.com/media/en/technical-documentation/data-sheets/adn2850.pdf>, Oct. 6, 2017, Internet Archive Wayback Machine <https://web.archive.org/web/20171006063214/https://www.analog.com/media/en/technical-documentation/data-sheets/adn2850.pdf> retrieved Jan. 26, 2022 (Year: 2022).*

(Continued)

*Primary Examiner* — Michael Carter
(74) *Attorney, Agent, or Firm* — Dority & Manning, P.A.

(57) ABSTRACT

A laser system includes: a laser light source; a light detector configured to output an electric current proportional to an output laser light of the laser light source; a resistor network configured to convert the electric current output from the light detector to a monitor voltage; and a regulator configured to control an intensity of the output laser light based on a comparison between the monitor voltage and a voltage corresponding to a control target value, wherein the resistor network comprises at least two branch circuits connected in parallel with each other, and the branch circuits include respective digital potentiometer circuits commonly formed in a single device.

6 Claims, 6 Drawing Sheets

(56) References Cited

U.S. PATENT DOCUMENTS

2007/0237195 A1* 10/2007 Sekigawa ............. H01S 5/0683
                                                                372/50.21
2010/0254413 A1* 10/2010 Tojo ........................ H01S 3/109
                                                                372/10
2012/0014400 A1    1/2012 Gerlach

FOREIGN PATENT DOCUMENTS

JP    2007/300085    11/2007
JP    2012/518903     8/2012

OTHER PUBLICATIONS

Japanese Office Action (w/ English translation) for corresponding Japanese Patent Application No. JP2019-056417, dated Mar. 29, 2021—9 pages.

* cited by examiner

LASER SYSTEM

TECHNICAL FIELD

The present invention relates to a laser system, and particularly relates to a laser system configured to automatically control the laser output.

BACKGROUND ART

Laser systems, such as those using a semiconductor laser or a diode-pumped solid-state laser, are used in a wide range of fields. Relatively small, low-power laser systems are often used for measurement applications or analysis applications, and in such cases, the requirement for stability and control accuracy of the laser output is often very high.

To maintain the laser output of the laser system constant, it is known to use a feedback-compensation automatic power controller, which is configured to detect a monitor light proportional to the laser output light with a light detector, to convert the photocurrent signal output from the light detector to a voltage signal, and to control the drive current of a semiconductor laser element or a pumping diode element by using the voltage signal as a feedback signal so that the intensity of the laser output light is maintained at a specified value.

The conversion of the photocurrent signal from the light detector to the voltage signal is performed by using a voltage drop occurring across a resistor when the photocurrent is passed through the resistor or using a voltage output at an output terminal of an operational amplifier when the photocurrent is passed through a feedback resistor of the operational amplifier.

The light detector may be installed in the same package as the semiconductor laser element. With such a light detector, a beam splitter for splitting the output light is unnecessary and thus the accuracy of light detection will not be influenced by the variation of reflectance between beam splitters. However, the variation of sensitivity between light detectors may be large and this may influence the accuracy of the light detection.

In some laser systems, the laser output light is monitored by a light detector provided separately from the semiconductor laser element. In this case, a beam splitter for directing part of the output light of the semiconductor laser element to the light detector is necessary, and the variation of reflectance between beam splitters influences the accuracy of light detection.

In the monitoring of the laser output light, even if the aforementioned variation exists, it is possible to compensate for the variation by using a trimmer resistor as the resistor for current-voltage conversion or the feedback resistor of the operational amplifier and adjusting the resistance of the trimmer resistor so that the nominal power is output from the laser system when a specific reference signal is given to an input of the laser system.

However, in the trimmer resistor, the contact resistance variation is on the order of 1% of the total resistance even if the trimmer resistor is a multi-turn type. When the resistance of the trimmer resistor is changed gradually, this appears as a discontinuous change corresponding to 1% of the total resistance. Also, when a temperature change or a vibration impact is applied after setting the resistance of the trimmer resistor, a change corresponding to 1% of the total resistance may occur.

In a case where the trimmer resistor is used with the resistance thereof set at the maximum value, this 1% change causes a 1% change in the monitor voltage. However, in a case where the trimmer resistor is used with the resistance thereof set at about 5% of the maximum value, this may cause a 20% change in the monitor voltage. Though the 1% change of the monitor voltage may be tolerable, the 20% change cannot.

As a system for solving these problems, there is a system that uses a digital potentiometer (hereinafter may be referred to as a Digi-POT) to convert the output current of the light detector to a voltage.

The Digi-POT is a device manufactured by a semiconductor manufacturing process, and includes many resistors called step resistors, each having the same resistance Rs, connected in series between a terminal A and a terminal B. Each of the connection points between adjacent resistors is referred to as a tap, and the Digi-POT is configured to be capable of electrically selecting one of the taps and connecting the selected tap to another terminal W, which may be referred to as a wiper terminal. In the Digi-POT, a resistance called a wiper resistance arises between the selected tap and the terminal W, and the resistance between the terminal A and the terminal W or between the terminal B and the terminal W can be changed in steps. The Digi-POT may be a rheostat type which does not have a terminal corresponding to the terminal B, but in the Digi-POT of the rheostat type also, the resistance between the terminal A and the terminal W can be changed in steps, and therefore, the following description will be similarly applied to the Digi-POT of the rheostat type.

Because the Digi-POT does not include a mechanically movable part, there is no instability factor like the contact resistance variation of the trimmer resistor. In a case where the Digi-POT has a total resistance $R_{AB}$ produced by 256 step resistors, if the set resistance thereof is near the total resistance $R_{AB}$, a change of the set resistance by one step will result in about 0.4% change of the resistance, and this change may be tolerable.

However, if the set resistance is much smaller than the total resistance $R_{AB}$, for example, near 5% of the total resistance $R_{AB}$, a change of the set resistance by one step will result in about 8% change of the resistance, and this change is too large to be tolerated.

As a system for solving this problem, there is an automatic power control system disclosed in U.S. Pat. No. 7,166,826B1, for example. In the system disclosed in U.S. Pat. No. 7,166,826B1, coarse adjustment of the control signal is provided by a digital variable resistor (such as a Digi-POT), while fine adjustment and compensation is provided by a digital-to-analog converter (D/A converter) that receives an input signal proportional to a sensed control system parameter, such as temperature. The configuration, calibration, or temperature compensation information, or the like, for use by the variable resistor and/or D/A converter is stored in a non-volatile memory.

In the systems including a D/A converter, the output voltage of the D/A converter and/or the monitor voltage when the laser light corresponding to the nominal power is output can vary from one laser system to another, and the adjustment and compensation by the D/A converter may affect the monitor value which is obtained from the monitor voltage. If only digital monitoring is performed (namely, the monitor value is obtained by processing the monitor voltage by a microcomputer or the like), this would not cause much problem (the monitor value can be easily adjusted by the microprocessor such that the monitor value can be used conveniently by a user), but when an analog monitor output which may be obtained by amplifying the monitor voltage by a non-inverting amplifier is needed, it is necessary to provide an arrangement for adjusting the amplification factor of the amplifier to adjust the monitor value because otherwise the monitor value corresponding to the laser light at 100 percent output power can vary from one laser system to another, which would be inconvenient to the user. Further, when a configuration is made such that the control target value of the laser output can be set as an analog voltage signal supplied from outside instead of the signal output from the D/A converter, the conversion coefficient between the analog voltage and the laser output light may vary from one laser system to another.

SUMMARY OF THE INVENTION

A primary object of the present invention is to provide a laser system, in which the conversion rate of the laser output light to the monitor value used in the automatic power control can be adjusted precisely so that the automatic power control is performed highly accurately.

According to one embodiment of the present invention, a laser system comprises: a laser light source (10; 60); a light detector (14) configured to output an electric current proportional to an output laser light of the laser light source; a resistor network (40) configured to convert the electric current output from the light detector to a monitor voltage (Vm); and a regulator (22, 25) configured to control an intensity of the output laser light based on a comparison between the monitor voltage and a voltage (Vref) corresponding to a control target value, wherein the resistor network (40) comprises at least two branch circuits connected in parallel with each other, and the branch circuits include respective digital potentiometer circuits (42, 44) commonly formed in a single device (46).

According to this configuration, compared to the case where only a single digital potentiometer circuit is used, the conversion rate of the laser output light to the monitor value (voltage) can be adjusted precisely with high resolution, and in addition, because the multiple digital potentiometer circuits are formed in the same device, the variation of the total resistance between the digital potentiometer circuits is small compared to the case where the multiple digital potentiometer circuits are formed in individual different devices. Thereby, the automatic power control can be performed with high accuracy.

The laser light source of the laser system may include a semiconductor laser element (10) or a diode-pumped solid-state laser system (60).

In the above laser system, preferably, one of the branch circuits includes an additional resistor (48) connected in series with the digital potentiometer circuit (42) thereof.

According to this configuration, the resolution of the conversion rate of the laser output light to the monitor value can be made even higher and the automatic power control can be performed even more accurately.

In the above laser system, preferably, the additional resistor (48) has a resistance (Ra) about half of a value obtained by dividing a nominal value of a total resistance ($R_{AB}$) of the digital potentiometer circuit (42) by a number of steps of the digital potentiometer circuit.

According to this configuration, it is ensured that the branch circuits do not have the same resistance, and therefore, the number of combinations for setting the combined resistance of the resistor network increases, whereby the combined resistance can be adjusted precisely.

In the above laser system, preferably, the device (46) includes a non-volatile memory (50) configured to store information regarding settings of the digital potentiometer circuits (42, 44).

According to this configuration, by referring to the information regarding settings of the digital potentiometer circuits stored in the non-volatile memory, it is possible to restart the operation of the laser system easily and quickly.

Preferably, the laser system further comprises an output terminal (32) configured to output a monitor signal corresponding to the monitor voltage to outside.

According to this configuration, it is unnecessary to separately adjust the conversion rate between the monitor voltage and the monitor signal to be output from the output terminal (32).

Preferably, the laser light source comprises a laser resonator (70, 72), and the laser system further comprises: a thermistor (76) configured to measure a temperature of the laser resonator; and another resistor network (41) configured to set a target temperature of the laser resonator, the other resistor network including at least two branch circuits connected in parallel with each other, each branch circuit being provided with a digital potentiometer circuit (80, 82).

According to this configuration, the temperature of the laser resonator can be adjusted easily by comparing the resistance (Rth) of the thermistor (76) and the resistance (Rc) of the other resistor network (41).

Thus, in the laser system according to one embodiment of the present invention, the conversion rate of the laser output light to the monitor value used in the automatic power control can be adjusted precisely so that the automatic power control is performed highly accurately.

DESCRIPTION OF THE PREFERRED EMBODIMENT(S)

First Embodiment

Figure 1:
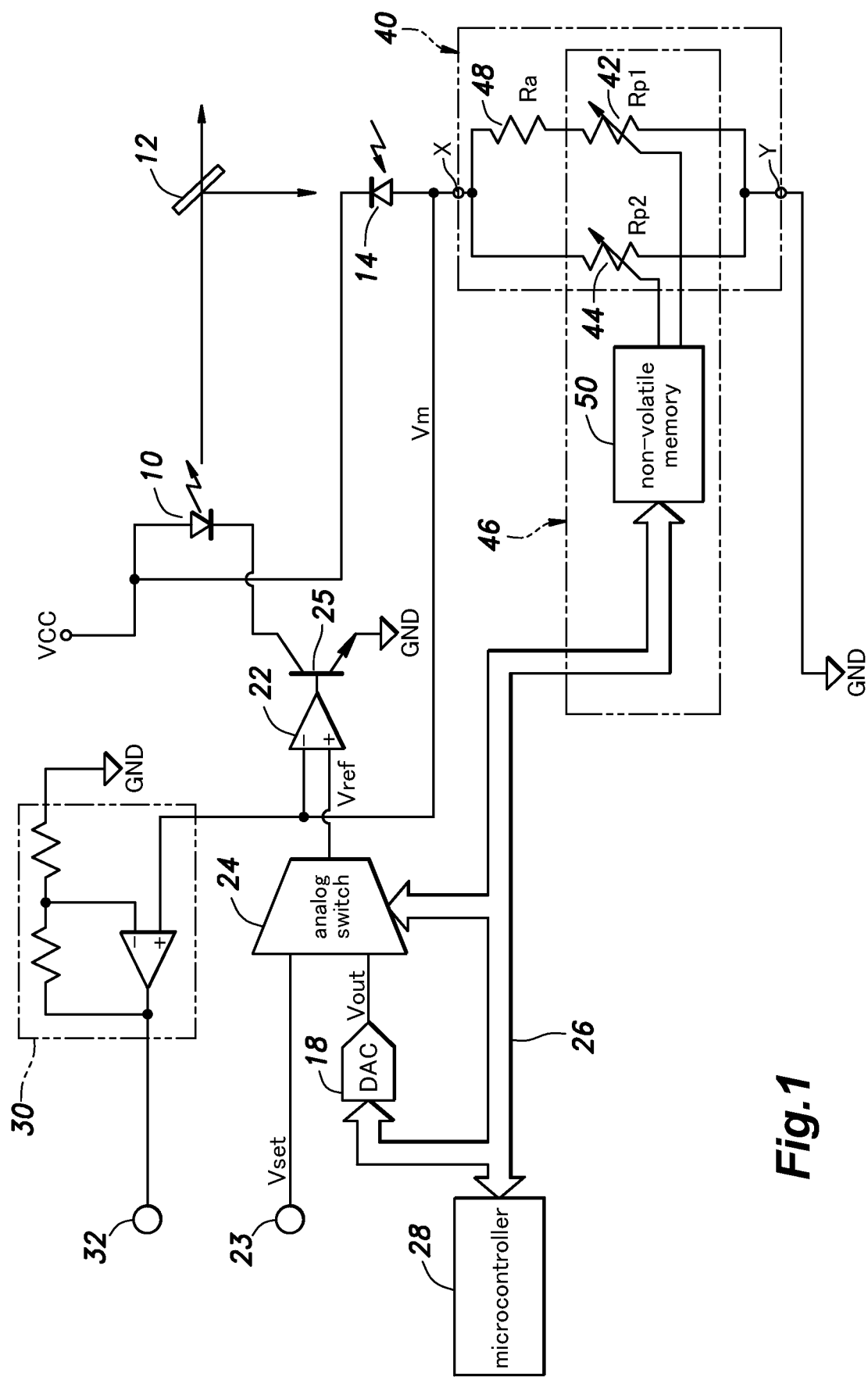
FIG. 1 is a circuit diagram of a first embodiment of a laser system according to the present invention.

A first embodiment of a laser system will be described below with reference to FIG. 1.

The laser system includes a semiconductor laser element 10 as a laser light source. The semiconductor laser element 10 is configured to output the laser light in one direction. A beam splitter 12 is placed in front of the semiconductor laser element 10. The laser output light from the semiconductor laser element 10 is collimated by an optical lens (not shown in the drawings), and then, is split by the beam splitter 12 into an output light and a monitor light for feedback compensation control.

The monitor light is a laser light proportional to the laser output light and enters a light detector 14. The light detector 14 is constituted of a photodiode, to which is applied a bias voltage, or the like. The light detector 14 is configured such that an electric current proportional to the light quantity of the monitor light flows therethrough. Namely, the light detector 14 outputs an electric current (photocurrent signal) proportional to the laser output light. This electric current flows through a resistor network 40 provided between a terminal X and a terminal Y. Thereby, an electric current proportional to the light quantity of the monitor light flows between the terminal X and the terminal Y, and a monitor voltage Vm proportional to the light quantity of the monitor light is generated between the terminal X and the ground (GND).

The monitor voltage Vm is input to the negative input terminal of an operational amplifier 22 as a feedback compensation signal. The positive input terminal of the operational amplifier 22 is configured such that either one of a power setting voltage Vset input through an external input terminal 23 and an output voltage Vout of a digital/analog converter 18 that is selected by an analog switch 24 is input thereto as a reference voltage (control target voltage) Vref for setting the intensity of the laser output light.

An output terminal of the operational amplifier 22 is connected to an input terminal (base terminal) of a transistor 25 for driving the semiconductor laser element 10, and the operational amplifier 22 is configured to vary the voltage at the output terminal thereof to adjust an operating current (collector current) of the transistor 25 such that the voltage at the negative input terminal of the operational amplifier 22 coincides with the voltage at the positive input terminal of the operational amplifier 22. Thereby, the laser output light of the semiconductor laser element 10 is controlled to a constant value determined by the reference voltage Vref. Thus, in this embodiment, the operational amplifier 22 and the transistor 25 constitute a regulator configured to control an intensity of the output laser light based on a comparison between the monitor voltage Vm and the reference voltage Vref (the power setting voltage Vset or the output voltage Vout of the digital/analog converter 18), which corresponds to the control target value.

The digital/analog converter 18 is connected to a microcontroller 28 via a serial bus 26, and a digital signal for setting the output voltage Vout is input thereto from the microcontroller 28. The analog switch 24 is connected to the microcontroller 28 via the serial bus 26 so that the switching of the analog switch 24 is performed in accordance with a command from the microcontroller 28.

The monitor voltage Vm is not only input to the negative input terminal of the operational amplifier 22 but also output to a monitor signal output terminal 32 as a monitor signal via a non-inverting amplifier circuit 30.

The resistor network 40 includes: a digital potentiometer device (Digi-POT device) 46 constituted of two circuits, namely, a first digital potentiometer circuit (first Digi-POT circuit) 42 and a second digital potentiometer circuit (second Digi-POT circuit) 44, which are connected in parallel with each other in the same device 46; and an additional resistor 48 consisting of a fixed resistor and connected in series with the first Digi-POT circuit 42. In other words, the resistor network 40 includes two branch circuits connected in parallel with each other such that the branch circuits respectively include the first Digi-POT circuit 42 and the second Digi-POT circuit 44 that are formed in the common single Digi-POT device 46, and, further, only the branch circuit including the first Digi-POT circuit 42 includes the additional resistor 48 connected in series with the first Digi-POT circuit 42.

For instance, each of the Digi-POT circuits 42, 44 has a total resistance $R_{AB}$ of 5 KΩ (nominal value) and a number of divisions (number of steps) of 256. It can be estimated from these values that the step resistance Rs is about 19.5Ω. The wiper resistance Rw is about 100Ω, for example.

The Digi-POT device 46 is configured to individually change a set resistance Rp1 of the first Digi-POT circuit 42 and a set resistance Rp2 of the second Digi-POT circuit 44 in accordance with a command sent from the microcontroller 28.

The Digi-POT device 46 includes a non-volatile memory 50. The non-volatile memory 50 is configured to store information regarding the settings of the first Digi-POT circuit 42 and the second Digi-POT circuit 44 and is constantly updated to store the latest values of the set resistance Rp1 of the first Digi-POT circuit 42 and the set resistance Rp2 of the second Digi-POT circuit 44 during operation. When not supplied with power, the non-volatile memory 50 holds the last stored data (the set resistances Rp1, Rp2). When the supply of power is resumed, the set resistances Rp1 and Rp2 of the first Digi-POT circuit 42 and the second Digi-POT circuit 44 are automatically set to the last values thereof in the previous operation (values at the time when the supply of power was stopped) stored in the non-volatile memory 50. Thereby, the restart of the operation of the laser system can be accomplished easily and quickly.

Provided that the step resistance and the wiper resistance of each of the first Digi-POT circuit 42 and the second Digi-POT circuit 44 are Rs and Rw, the first Digi-POT circuit 42 has a wiper value m1 selected from integers from 1 to 256, the second Digi-POT circuit 44 has a wiper value m2 selected from integers from 1 to 256, and the resistance of the additional resistor 48 is Ra, a resistance Rb1 of the first branch circuit including the first Digi-POT circuit 42 and the additional resistor 48 and a resistance Rb2 of the second branch circuit including the second Digi-POT circuit 44 are respectively represented by following Equations (1) and (2).

$$Rb1=Rp1+Ra=m1\times Rs+Rw+Ra \qquad (1)$$

$$Rb2=Rp2=m2\times Rs+Rw \qquad (2)$$

It is to be noted that the wiper value m1 indicates the one of the taps of the first Digi-POT circuit 42 connected to the wiper terminal of the same and may represent the number of step resistors connected in series between the wiper terminal and a reference terminal (terminal A or B) of the first Digi-POT circuit 42. Similarly, the wiper value m2 indicates the one of the taps of the second Digi-POT circuit 44 connected to the wiper terminal of the same and may represent the number of step resistors connected in series between the wiper terminal and a reference terminal (terminal A or B) of the second Digi-POT circuit 44.

A combined resistance (total resistance) Rc of the resistor network 40 between the terminal X and the terminal Y can be represented by following Equation (3).

$$Rc=\{(1/Rb1)+(1/Rb2)\}^{-1} \qquad (3)$$

The larger the number of combinations of the resistance Rb1 of the first branch circuit and the resistance Rb2 of the second branch circuit is, the more different values the combined resistance Rc can have. In a case where the resistance Ra of the additional resistor 48 is 0, the combined resistance Rc is the same even if the values of the wiper value m1 and the wiper value m2 are exchanged with each other. In a case where the resistance Ra of the additional resistor 48 is a value not equal to 0 (more preferably, a value that is not a multiple of the step resistance Rs), the resistance Rb1 of the first branch circuit and the resistance Rb2 of the second branch circuit do not become the same, and therefore, compared to the case where the resistance Ra is 0, the combined resistance Rc can be selected from a larger number of different values corresponding to a larger number of combinations of the resistance Rb1 and the resistance Rb2.

To determine favorable values of the resistance Ra of the additional resistor 48, for various values of the resistance Ra, the combined resistance Rc was obtained for all combinations of the wiper value m1 and the wiper value m2. The obtained values of the combined resistance Rc are represented by Rc(k) where k is a natural number and the smallest value of the combined resistance Rc is represented by Rc(1), the second smallest value of the combined resistance Rc is represented by Rc(2), and so on. Then, a resistance change rate δ defined by following Equation (4) was calculated and evaluated for the various values of the resistance Ra of the additional resistor 48, the evaluation result being shown in the graph of FIG. 2.

$$\delta = \{Rc(k+1) - Rc(k)\}/Rc(k) \qquad (4)$$

Figure 2:
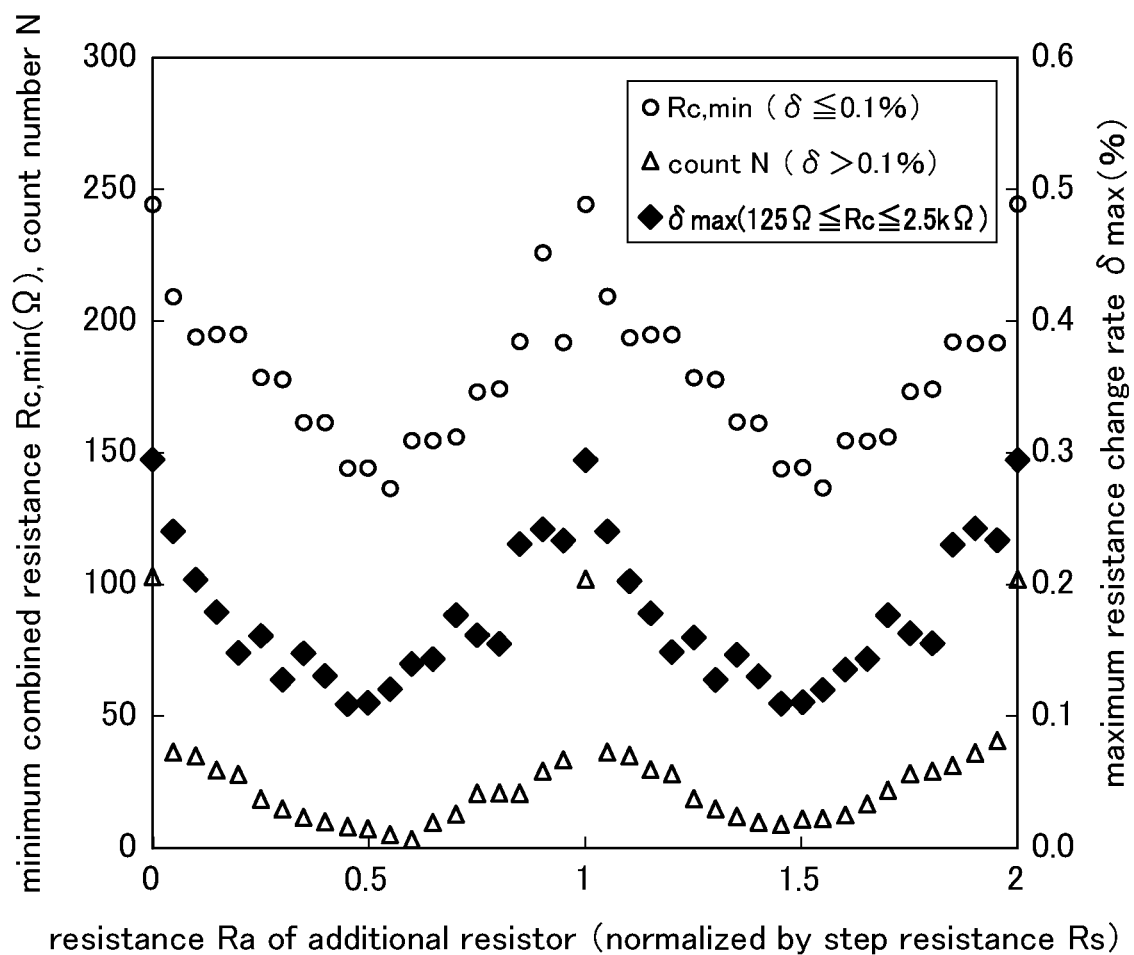
FIG. 2 is a graph showing an evaluation result for various values of a resistance of an additional resistor.

Specifically, FIG. 2 shows the following parameters obtained when the combined resistance Rc was varied gradually in a range corresponding to 5%-100% of the maximum value thereof (namely, in a range of 125Ω-2.5Ω): a count number N (white triangle) of the resistance Rc(k) for which the resistance change rate δ becomes greater than 0.1%; a maximum value δ max (black diamond) of the resistance change rate δ in the above range of the combined resistance Rc; and a minimum value min (white circle) of the combined resistance Rc for which the resistance change rate δ can be lower than or equal to 0.1%. To change the combined resistance Rc as smoothly as possible, it is preferred that these three parameters have smaller values.

The graph of FIG. 2 shows the evaluation result for the resistance Ra of the additional resistor 48 up to two times the step resistance Rs, and it can be said that the resistance Ra of the additional resistor 48 should preferably be set to a value near an odd number times a half of the step resistance Rs in order to change the combined resistance Rc as smoothly as possible over a wide resistance range.

However, the total resistance $R_{AB}$ has a tolerance of about ±20%, and the step resistance Rs also may vary to a similar extent from one Digi-POT device 46 to another. Therefore, in a case where the additional resistor 48 having the same resistance Ra is used in individual laser systems, the resistance Ra of the additional resistor 48 preferably is about half of the nominal value of the step resistance Rs. In other words, the resistance Ra of the additional resistor 48 preferably is about half of a value obtained by dividing the nominal value of the total resistance $R_{AB}$ of the first Digi-POT circuit 42 by the number of steps of the first Digi-POT circuit 42.

In this way, it is ensured that the two branch circuits do not have the same resistance, and therefore, the number of combinations for setting the combined resistance Rc of the resistor network 40 increases. This allows the combined resistance Rc to be adjusted more precisely. Further, the variation in adjustment resolution of the conversion rate between individual laser systems due to the variation of the total resistance $R_{AB}$ between different Digi-POT devices 46 can be reduced.

In the foregoing, the evaluation was made severely with the tolerable resistance change δ being set to 0.1%, but even if the tolerable resistance change rate δ is set to 1%, for example, it is still the same that the resistance Ra of the additional resistor 48 preferably is about half of the step resistance Rs to change the combined resistance Rc as smoothly as possible over a wide resistance range.

As described above, by simply connecting the two Digi-POT circuits 42, 44 in parallel, adjustment of the conversion rate of the intensity of the laser output light (output power) to the monitor value (voltage Vm) can be performed precisely with high resolution over a wide range in a manner that cannot be achieved by a single Digi-POT circuit. Moreover, by setting the resistance Ra of the additional resistor 48 connected in series with one of the two Digi-POT circuits 42, 44 to an odd number times Rs/2, the adjustment of the conversion rate between the output power and the monitor value (voltage Vm) can be performed even more precisely with high resolution and in an even wider range.

Thereby, in the laser system, the conversion rate of the laser output light to the monitor value used in the automatic power control can be adjusted precisely so that the automatic power control can be performed highly accurately.

In the first embodiment, the resistance Ra of the additional resistor 48 that is series-connected to the first Digi-POT circuit 42 included in the branch circuit is preferably set to 10Ω, which, of the resistances of readily available resistors, is the closest to 9.77Ω which is half of a value obtained by dividing the nominal value 5Ω of the total resistance of the first Digi-POT circuit 42 by the number of divisions (number of steps) 256.

The total resistance $R_{AB}$ could typically range ±20% from the targeted value from one Digi-POT device 46 to another (namely, the tolerance is ±20%), and hence, the step resistance Rs also varies to a similar extent. Therefore, if the Digi-POT circuits 42, 44 included in separate devices are combined, the above evaluation result may not apply. Moreover, unless the total resistances of the Digi-POT circuits 42, 44 are obtained beforehand, it is difficult to use them in a manner to increase or decrease the resistance gradually.

However, when the multiple (two) Digi-POT circuits 42, 44 are formed in the same device as in the present embodiment, the variation of the total resistance $R_{AB}$ in the device is about 1%, and therefore, even if the tolerance of the total resistance is ±20%, there is no problem in using the Digi-POT circuits 42, 44 in a manner to increase or decrease the resistance gradually.

Thus, the conversion rate between the output power and the monitor voltage can be adjusted precisely, whereby it is unnecessary to correct the output voltage Vout of the digital/analog converter 18. Further, even when the output power is controlled according to the power setting voltage Vset supplied from the external input terminal 23 due to switching of the analog switch 24, there is no need to change the conversion rate between the power setting voltage Vset and the output power. In addition, regarding the output of the monitor signal from the monitor signal output terminal 32 to outside, there is no need to adjust the conversion rate between the monitor voltage Vm and the monitor signal (or the amplification factor of the non-inverting amplifier circuit 30).

Figure 3:
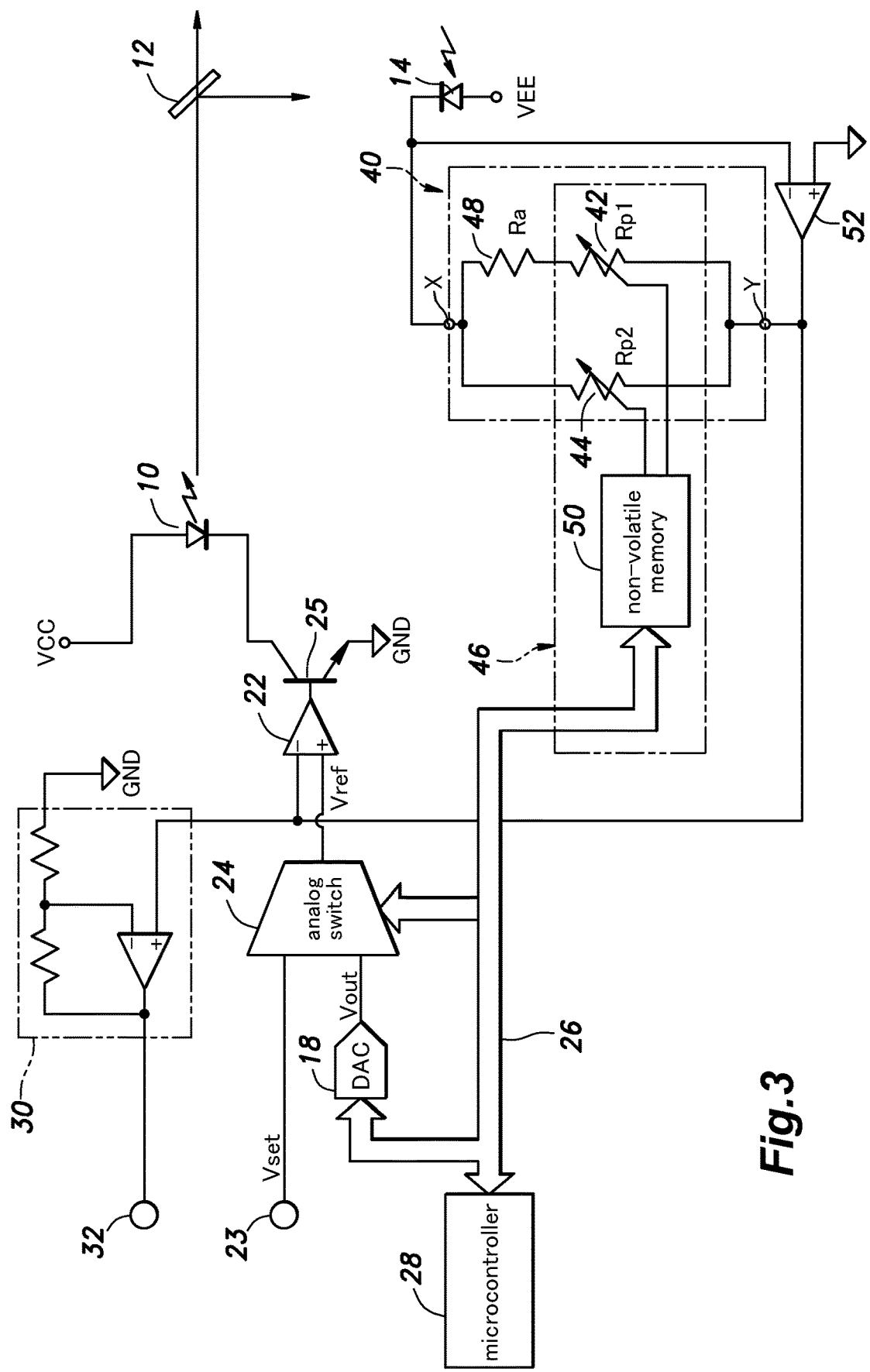
FIG. 3 is a circuit diagram of a modification of the laser system of the first embodiment.

Incrementing or decrementing the combined resistance Rc gradually requires substantial computation. Setting of the combined resistance Rc (or the set resistances Rp1, Rp2 of the first Digi-POT circuit 42 and the second Digi-POT circuit 44) is performed only at the manufacturing stage or at the time of maintenance of the laser system. Since the Digi-POT device 46 including the Digi-POT circuits 42, 44 is provided with the non-volatile memory 50, it is possible to determine the initial values of the wiper values m1 and m2 at the manufacturing stage and store them in the non-volatile memory 50, whereby, when the laser system is used, the operation can be started promptly by using the stored values. As a modification of the first embodiment, it is possible, as shown in FIG. 3, to apply a reverse bias voltage VEE to the light detector 14, to connect the light detector 14 to the negative input terminal of an operational amplifier 52, and to connect the resistor network 40 having the combined resistance Rc between the output terminal of the operational amplifier 52 and the negative input terminal of the operational amplifier 22.

Thus, the current-voltage conversion may be made with a circuit configured such that the signal from the output terminal of the operational amplifier 52 is used as a feedback signal.

Figure 4A:
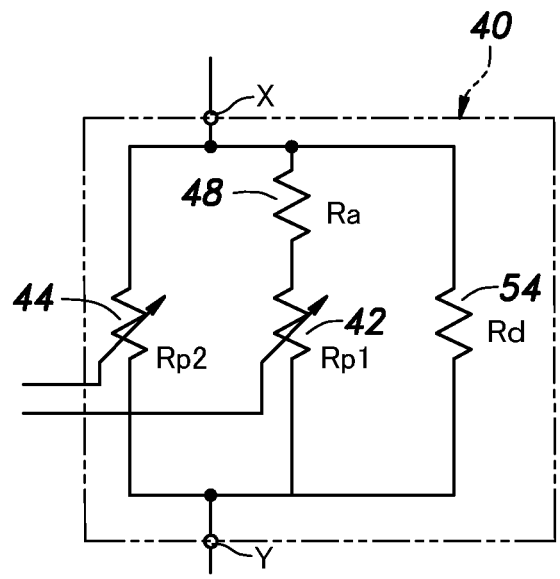
FIGS. 4A and 4B are circuit diagrams showing variations of a resistor network used in the laser system according to the present invention.
Figure 4B:
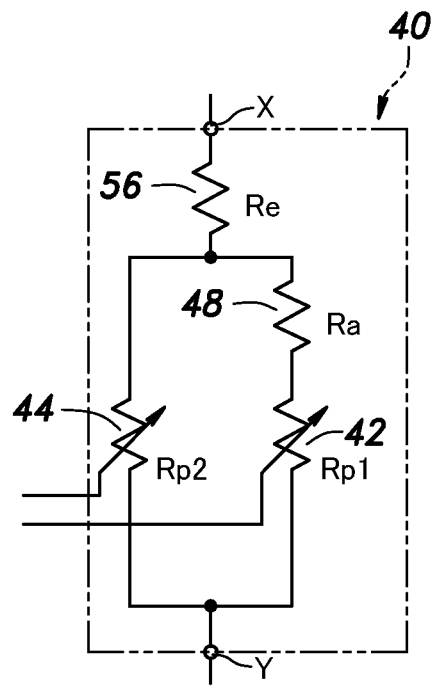

Further, various modifications of the resistor network 40 of the first embodiment may be possible. For instance, when it is desired to precisely adjust the resistance to a lower value, another additional resistor 54 having a resistance Rd may be connected in parallel with the parallel circuit of the series-connected first Digi-POT circuit 42 and additional resistor 48, and the second Digi-POT circuit 44, as shown in FIG. 4A. Also, when it is required to adjust the resistance to a higher value, another additional resistor 56 having a resistance Re may be connected in series with the parallel circuit of the series-connected first Digi-POT circuit 42 and additional resistor 48, and the second Digi-POT circuit 44, as shown in FIG. 4B.

In the first embodiment, the semiconductor laser element 10 and the monitoring photodiode element serving as the light detector 14 are independent from each other. However, the present invention may be applied to a configuration in that the semiconductor laser element 10 and the photodiode element are incorporated into a single package such that the photodiode element detects the light leaking from a side of the semiconductor laser element 10 opposite from the output side.

Second Embodiment

Figure 5:
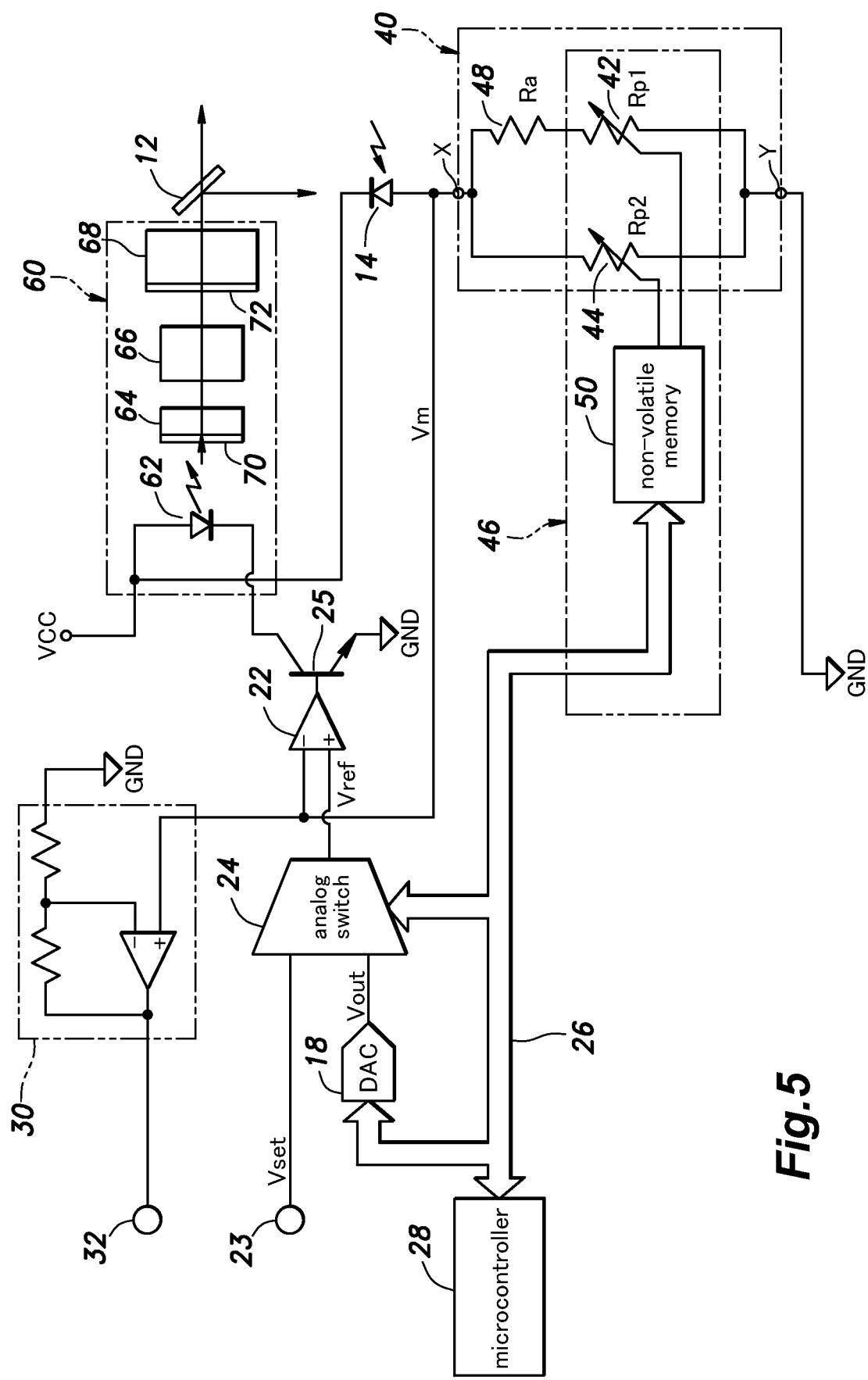
FIG. 5 is a circuit diagram of a second embodiment of the laser system according to the present invention.

A second embodiment of the laser system will be described below with reference to FIG. 5. It is to be noted that in FIG. 5, the parts corresponding to those shown in FIG. 1 are denoted by the same reference numerals as in FIG. 1 and the description thereof is not repeated.

In the second embodiment, a diode-pumped solid-state laser system 60 is used as a laser light source. The diode-pumped solid-state laser system 60 includes, in a laser head thereof, a pumping diode element 62, a solid-state laser crystal 64, a nonlinear optical crystal 66, and an output mirror substrate 68. The output mirror substrate 68 consists of a glass substrate and defines a concave surface facing the pumping diode element 62.

The pumping diode element 62 has a laser wavelength of 808 nm and a light output of 2 W at the maximum. The solid-state laser crystal 64 is made of Nd:YVO4 processed into a flat plate shape and is arranged to use the laser light having a wavelength of 808 nm as an excitation source. The solid-state laser crystal 64 has a first multilayer film mirror 70 on one surface thereof and constitutes a laser resonator between the first multilayer film mirror 70 and a second multilayer film mirror 72 provided on the concave surface of the output mirror substrate 68 to generate a laser light having a wavelength of 1064 nm.

The nonlinear optical crystal 66 is made of potassium titanate phosphate ($KTiOPO_4$, KTP) processed into a rectangular cuboid and converts the laser light with a wavelength of 1064 nm into a laser light with a wavelength of 532 nm, which is a second harmonic wave of the laser light with a wavelength of 1064 nm, due to its secondary nonlinear effect. The second harmonic wave produced by this wavelength conversion is taken out as an output light.

As the transistor 25, a transistor having a capacity capable of supplying sufficient electric current to the pumping diode element 62 is used. In the second embodiment also, the resistor network 40 constituted of the combination of the two Digi-POT circuits 42, 44 formed on a single device and the additional resistor 48 is used as a resistor for converting the light monitor current into a monitor voltage, whereby the advantage that the conversion coefficient can be adjusted precisely is obtained similarly to the first embodiment.

The diode-pumped solid-state laser system 60 requires temperature control to cool the pumping diode element 62 and to maintain constant the temperature of the nonlinear optical crystal 66 for the wavelength conversion, but description and illustration of the elements and circuits necessary therefor are omitted here for the sake of simplicity.

Third Embodiment

A third embodiment of the laser system will be described below with reference to FIG. 6. It is to be noted that in FIG. 5, the parts corresponding to those shown in FIG. 1 and/or FIG. 5 will be denoted by the same reference numerals as in FIG. 1 and FIG. 5 and the description thereof is not repeated.

Figure 6:
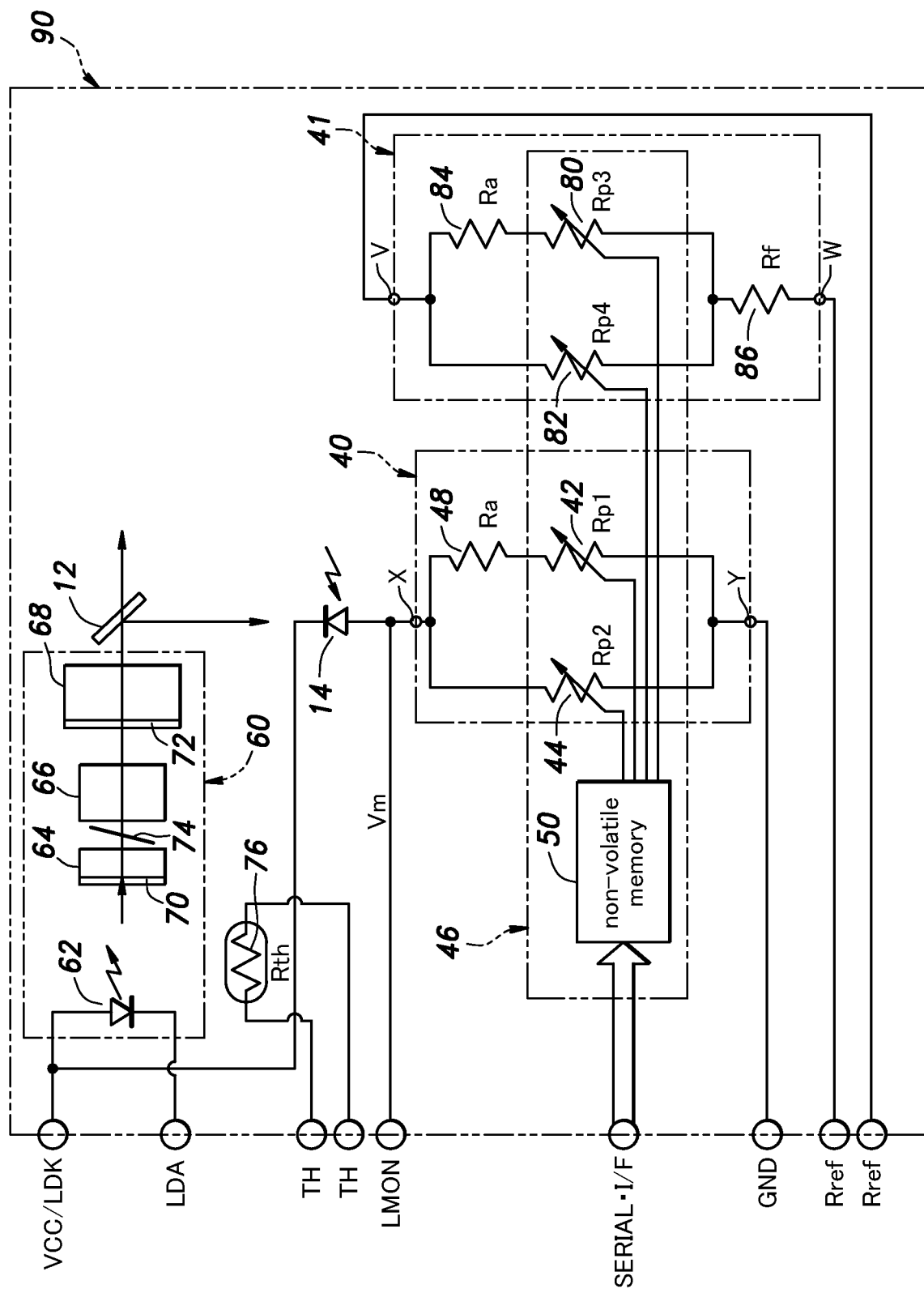
FIG. 6 is a circuit diagram of a third embodiment of the laser system according to the present invention.

FIG. 6 shows the configuration of a head 90 of the laser system. The head 90 includes the diode-pumped solid-state laser system 60. The diode-pumped solid-state laser system 60 includes an etalon 74 positioned between the solid-state laser crystal 64 and the nonlinear optical crystal 66 in addition to the pumping diode element 62, the solid-state laser crystal 64, the nonlinear optical crystal 66, the output mirror substrate 68, the first multilayer film mirror 70, and the second multilayer film mirror 72. The etalon 74 is a type called a solid etalon, which is made of a quartz glass substrate having both sides coated with multilayer films having a reflectance of several tens percent for the oscillation wavelength of the solid-state laser crystal 64. Owing to the addition of the etalon 74, the diode-pumped solid-state laser system 60 can oscillate in a single longitudinal mode. The anode and cathode of the pumping diode element 62 are respectively connected to cathode connector terminals VCC/LDK and LDA provided on the head 90 so as to be connectable from outside. The diode-pumped solid-state laser system 60 includes a Peltier element for heating or cooling, but the illustration thereof in the drawings is omitted.

The laser system of the third embodiment includes a thermistor 76 for measuring the temperature of the diode-pumped solid-state laser system 60 (specifically, the laser resonator thereof). The two electrodes of the thermistor 76 are connected to respective connector terminals TH provided on the head 90 so as to be connectable from outside. The thermistor 76 used in this embodiment exhibits a resistance of 10Ω at 25° C. and has a B constant of 3380 K. In a case where the temperature is controlled in a range from 35° C. to 45° C., the resistance of the thermistor 76 changes in a range from 6.9 kΩ to 4.9 kΩ. An average change rate of the resistance in that range is −200 Ω/° C.

In addition to the first Digi-POT circuit 42 and the second Digi-POT circuit 44, the Digi-POT device 46 further includes therein a third Digi-POT circuit 80 and a fourth Digi-POT circuit 82 that are connected in parallel with each other. Thus, the four Digi-POT circuits 42, 44, 80, and 82 are provided in the single Digi-POT device 46. As in the first and second embodiments, the additional resistor 48 having the resistance Ra, which is 10Ω, for example, is connected in series with the first Digi-POT circuit 42.

The terminal X and the terminal Y of the resistor network 40 including the first Digi-POT circuit 42, the second Digi-POT circuit 44, and the additional resistor 48 are respectively connected to connector terminals LMON and GND provided on the head 90 so as to be connectable from outside. Also, the cathode of the light detector 14 is connected to a connector terminal VCC/LDK provided on the head 90 so as to be connectable from outside. It is to be noted that the connector terminal VCC/LDK is commonly connected to the anode of the pumping diode element 62 also such that a reverse bias voltage is applied to the light detector 14.

The non-volatile memory 50 included in the Digi-POT device 46 is connected to a connector terminal SERIAL•I/F provided on the head 90 so as to be connectable with a microcontroller outside the head 90.

As in the illustrated embodiment, when the diode-pumped solid-state laser system 60 includes the etalon 74 as a wavelength control element in the laser resonator such that the diode-pumped solid-state laser system 60 operates in the single longitudinal mode, it is necessary to find an optimum operation temperature by changing the temperature of the etalon 74 itself or the temperature of the overall laser resonator in increments of less than 0.1° C., for example, and to keep the optimum temperature. On the other hand, compared with the laser system of the first embodiment in that the light source is a semiconductor laser, the laser system using the diode-pumped solid-state laser system 60 as a light source generates a significantly greater amount of heat, and therefore, it may be desirable to separate the light source section and the drive section such that the heat sources are not concentrated. In addition, it is desired that when only one of the light source section and the drive section is replaced, the laser system can operate without performing the process of finding the optimum operation temperature again.

To achieve this, in the third embodiment, the single Digi-POT device 46 includes, in addition to the first Digi-POT circuit 42 and the second Digi-POT circuit 44, a parallel circuit of the third digital potentiometer circuit (third Digi-POT circuit) 80, to which an additional resistor 84 having a resistance Ra of 10Ω is connected in series, and the fourth digital potentiometer circuit (fourth Digi-POT circuit) 82. Further, another additional resistor 86 having a resistance Rf of 4.7 kΩ is connected in series with the parallel circuit of the third and fourth Digi-POT circuits 80 and 82 to form a resistor network 41 for adjusting a set temperature (or target temperature) within a predetermined range.

Thereby, even when a Digi-POT circuit having the total resistance $R_{AB}$ that is the minimum within the tolerance range is used as each of the third Digi-POT circuit 80 and the fourth Digi-POT circuit 82, the combined resistance Rc of the resistor network 41 (namely, the resistance between a terminal V and a terminal W of the resistor network 41) can be adjusted in a range from about 4.8 kΩ to about 6.8 kΩ. This resistance range is substantially the same as the range of the resistance of the thermistor 76 corresponding to the aforementioned temperature setting range. To enable the resistor network 41 constituted between the terminals V and the terminal W for temperature setting to be connected from outside, the terminal V and the terminal W are connected to respective connector terminals Rref provided on the head 90.

The microcontroller outside the head 90 can detect a potential difference corresponding to the temperature difference (difference between the set temperature represented by the combined resistance Rc of the resistor network 41 and the temperature of the diode-pumped solid-state laser system 60 represented by the resistance Rth of the thermistor 76) by using a Wheatstone bridge circuit in which two of the four resistors constituting the Wheatstone bridge circuit consist of fixed resistors having the same resistance and the remaining two respectively consist of the resistor network 41 having the combined resistance Rc between the terminal V and the terminal W and the thermistor 76 having the resistance Rth, so that the microcontroller can perform the temperature control so as to make the potential difference zero.

When the wiper values m1 and m2 in Equations (1) and (2) referred to by Equation (3) for obtaining the combined resistance Rc are both zero, the combined resistance Rc has the minimum value, and the difference between the minimum value and the next minimum value of the combined resistance Rc is about 4Ω, which corresponds to the temperature difference of about 0.02° C. Other than this, the difference {Rc(k+1)−Rc(k)} is smaller than or equal to 2Ω, which corresponds to 0.01° C., where Rc(k) represents the selectable values of the combined resistance Rc arranged in order of magnitude. Thereby, fine adjustment of the set temperature can be achieved.

Also, since the thermistor 76 and the resistor network 41 for temperature setting are both included in the head 90, even when only the controller is replaced, an operation can be started with an optimum temperature without need for making adjustment of the head 90 and the controller.

In the foregoing, the present invention has been described in terms of preferred embodiments thereof, but the present invention is not limited to these embodiments and may be modified or altered as appropriate without departing from the scope of the present invention. For instance, the number of branch circuits of the resistor network 40 is not limited to two, and may be more than two. Also, not all of the components shown in the foregoing embodiments are necessarily indispensable and they may be selectively adopted as appropriate without departing from the scope of the present invention.

The invention claimed is:
1. A laser system, comprising:
a laser light source;
a light detector configured to output an electric current proportional to an output laser light of the laser light source;
a resistor network configured to convert the electric current output from the light detector to a monitor voltage; and
a regulator configured to control an intensity of the output laser light based on a comparison between the monitor voltage and a voltage corresponding to a control target value,
wherein the resistor network comprises at least two branch circuits connected in parallel with each other,
the branch circuits include respective digital potentiometer circuits commonly formed in a single device,
one of the branch circuits includes an additional resistor connected in series with the digital potentiometer circuit thereof, and the additional resistor has a resistance about half of a value obtained by dividing a nominal value of a total resistance of the digital potentiometer circuit by a number of steps of the digital potentiometer circuit.

2. The laser system according to claim 1, wherein the device comprises a non-volatile memory configured to store information regarding settings of the digital potentiometer circuits.

3. The laser system according to claim 1, further comprising an output terminal configured to output a monitor signal corresponding to the monitor voltage to outside.

4. The laser system according to claim 1, wherein the laser light source comprises a laser resonator, and the laser system further comprises:
 a thermistor configured to measure a temperature of the laser resonator; and
 another resistor network configured to set a target temperature of the laser resonator, the another resistor network including at least two branch circuits connected in parallel with each other, each branch circuit being provided with a digital potentiometer circuit.

5. The laser system according to claim 1, wherein the laser light source comprises a semiconductor laser element.

6. The laser system according to claim 1, wherein the laser light source comprises a diode-pumped solid-state laser system.

* * * * *